United States Patent [19]
Martin

[11] Patent Number: 4,918,403
[45] Date of Patent: * Apr. 17, 1990

[54] FREQUENCY SYNTHESIZER WITH SPUR COMPENSATION

[75] Inventor: Frederick L. Martin, North Lauderdale, Fla.

[73] Assignee: Motorola, Inc., Schaumburg, Ill.

[*] Notice: The portion of the term of this patent subsequent to Mar. 18, 2006 has been disclaimed.

[21] Appl. No.: 329,239

[22] Filed: Mar. 27, 1989

Related U.S. Application Data

[63] Continuation of Ser. No. 202,065, Jun. 3, 1988, Pat. No. 4,816,774.

[51] Int. Cl.$^4$ .............................................. H03L 7/18
[52] U.S. Cl. ...................................... 331/1 A; 331/16; 455/260
[58] Field of Search ...................... 331/1 A, 16, 18, 25; 455/260

[56] References Cited

U.S. PATENT DOCUMENTS

| | | | |
|---|---|---|---|
| 3,928,813 | 12/1975 | Kingsford-Smith | 331/1 A |
| 3,976,945 | 8/1976 | Cox | 328/14 |
| 4,101,838 | 7/1978 | Aihara et al. | 328/63 |
| 4,184,068 | 1/1980 | Washburn | 235/92 |
| 4,204,174 | 5/1980 | King | 331/10 |
| 4,231,104 | 10/1980 | St. Clair | 364/900 |
| 4,423,381 | 12/1983 | Stepp et al. | 328/14 |
| 4,468,797 | 8/1984 | Shin | 377/52 |
| 4,472,820 | 9/1984 | Borras | 377/52 |
| 4,556,984 | 12/1985 | Genrich | 377/47 |
| 4,609,881 | 9/1986 | Wells | 331/1 A |
| 4,694,475 | 9/1987 | Mehrgardt | 377/48 |
| 4,758,802 | 7/1988 | Jackson | 331/10 |
| 4,815,018 | 3/1989 | Reinhardt et al. | 364/701 |
| 4,816,774 | 3/1989 | Martin | 331/1 A |

OTHER PUBLICATIONS

"ESSCIRC" 82, Eighth European Solid State Circuits Conference, Brussels, Belgium, Sep. 22–24, 1982, pp. 145 to 148, discloses a rate multiplier.

Primary Examiner—David Mis
Attorney, Agent, or Firm—Daniel K. Nichols; Juliana Agon

[57] ABSTRACT

A synthesizer circuit with spur compensation utilizes fractional division in the synthesizer loop. Two accumulators are utilized for determining the divisor value N. The capacity of the two accumulators is selectable. An offset value is selectively introduced into the accumulators in order to produce a waveform having an acceptable spurious content.

6 Claims, 5 Drawing Sheets

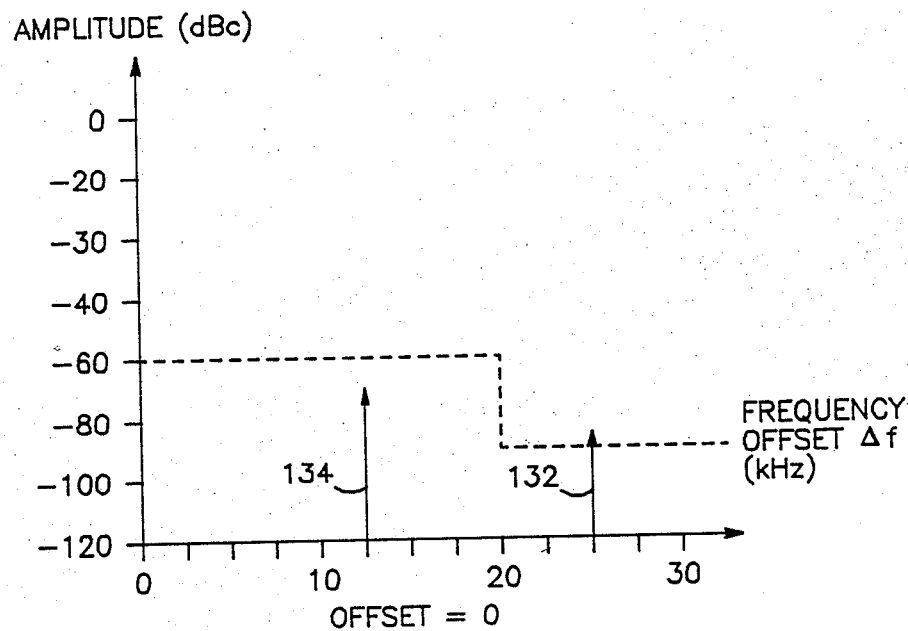
FIG. 6
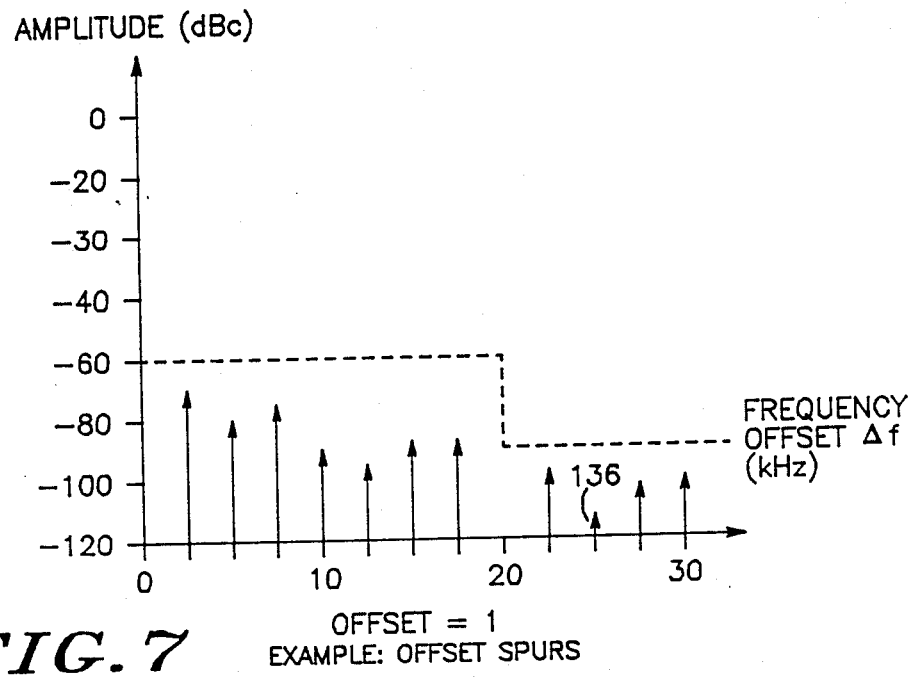
FIG. 7 OFFSET = 1
EXAMPLE: OFFSET SPURS

FREQUENCY SYNTHESIZER WITH SPUR COMPENSATION

CROSS REFERENCE TO RELATED APPLICATION

This is a continuation of application Ser. No. 07/202,065, filed June 3, 1988 now U.S. Pat. No. 4,816,774.

BACKGROUND OF THE INVENTION

This invention relates to frequency synthesizers in general, and more particular, to a fractional-N-frequency synthesizer in which selectable frequency outputs are produced while reducing unwanted spurious outputs. Frequency divider circuits are used in frequency synthesizer circuits such as in a phase lock loop (PLL). In a fractional-N-synthesis PLL circuit, the output frequency $f_o$ of a voltage controlled oscillator (VCO) is first divided and then applied to a phase detector which operates in a conventional manner comparing the phase of the divided output signal with a reference frequency $f_r$ from a reference oscillator, in order to control the VCO output frequency $f_o$. The output frequency $f_o$ is related to the reference frequency of the reference frequency source by the relationship $f_o = (N.F) \times f_r$. N.F is the effective divisor by which the output frequency is divided before it is compared with the reference frequency. N.F is produced by a divider control circuit and consists of an integer part N and a fractional part F. The fractional part $F = k/D$ where k and D are both integers.

Since a divider operates with integer values, fractional division is simulated by switching between different integer values of divisors. However, this switching of the divisors results in spurious sidebands in the synthesized output frequency signal $f_o$. The goal in designing a synthesizer is to keep the amplitudes of these subharmonic spurs below some maximum acceptable limit.

An approach, illustrated in U.S. Pat. No. 4,204,174, to cancel unwanted spurious signals utilizes two accumulators to simulate the fractional division and a digital-to-analog converter to generate a correction signal to back-off the resultant spurious sidebands. U.S. Pat. No. 4,694,475 also illustrates the use of two accumulators for a frequency divider circuit. Basically, both methods utilize a first accumulator to correct for phase error and a second accumulator to which the instantaneous contents of the first accumulator is summed at each cycle of the divider output. For each clock cycle in which the second accumulators fixed capacity D is reached, the divisor is increased by one from its programmed value. On each succeeding clock cycle, the divisor N is decreased by one from its programmed value. The net effect on the average divisor is zero since counts are always added and subtracted in pairs. Such two accumulator approaches provide a single unique waveform and associated spurious response for each value of numerator k for the fractional part of the divider and capacity D of the accumulators for a synthesizer of a predetermined loop bandwidth.

The one unique waveform can result in unacceptable spurious signals for a desired output frequency $f_o$. In some applications, spurious signals with 20 kHz of a desired frequency $f_o$ must be 60 dB below the carrier $f_o$ frequency signal while spurious signals further than 20 kHz from the carrier frequency must be 90 dB below the carrier level. With the waveform provided by prior art two accumulator approaches, the spurious signals can exceed the desired limits. FIG. 6 illustrates such a situation. In this illustration, spur 134 is within desired limits, however, spur 132 exceeds desired limits.

In applications such as two-way radios, minimizing hardware along with eliminating the effects of spurs is of utmost importance.

SUMMARY OF THE INVENTION

This frequency synthesizer with spur compensation provides means for changing the spurious output of a synthesizer for any output frequency $f_o$, thereby providing different spurious responses. A waveform having acceptable spurs is utilized to produce the desired output frequency.

The synthesizer includes loop having a programmable divider. A divider control means provides divider values to the programmable divider and includes means providing varying values to the divider for fractional division to produce a desired output frequency. The divider control means includes first and second accumulator means. The first accumulator means includes an input for receiving data, a first output for varying the divide value and a second output for providing data to the second accumulator means. The second accumulator means includes an input connect to the second output of the first accumulator means and an output for varying the divide value.

In one aspect of the invention the first and second accumulator means each have a variable capacity. In another aspect of the invention means provide an offset value to the first or second accumulator means.

BRIEF DESCRIPTION OF THE DRAWINGS

FIG. 6 illustrates an example of the frequency response of a two accumulator synthesizer in accordance with prior art approaches.

FIG. 7 illustrates the frequency response of the frequency synthesizer of the present invention for a selected waveform.

DESCRIPTION OF THE PREFERRED EMBODIMENT

Figure 1:
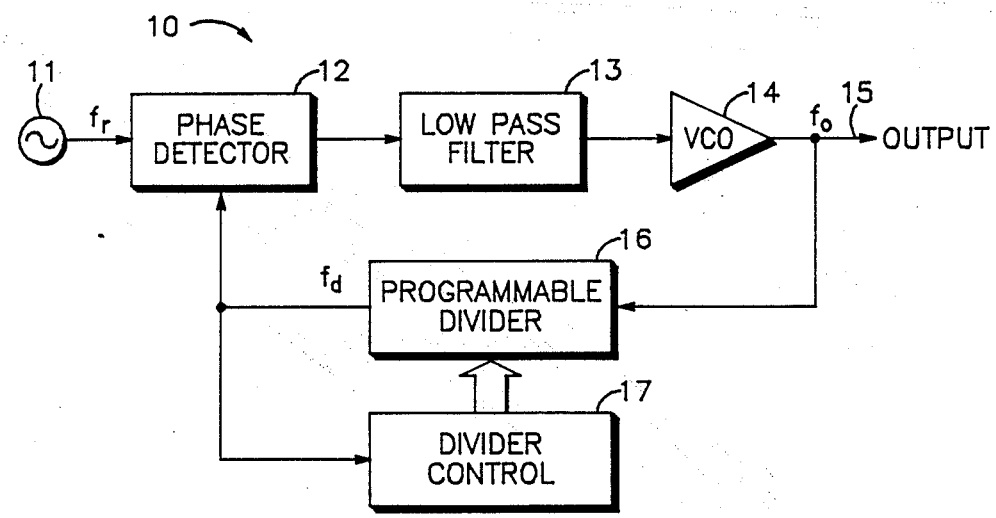
FIG. 1 is a block diagram of a frequency synthesizer with spur compensation in accordance with the present invention.

Referring now by characters of reference to the drawings and first to FIG. 1, it will be understood that a frequency synthesizer 10, in accordance with the present invention, includes a reference oscillator 11. The output of reference oscillator 11 $f_r$ is applied to a phase detector 12 that has its output coupled, via a low pass filter 13, to a voltage controlled oscillator (VCO) 14. The output of VDO 14 is connected to the output 15 of the frequency synthesizer 10 and to a programmable divide by N divider 16. VCO 14 provides the synthesizer output signal $f_o$. The output of divider 16 provides a divided signal $f_d$ to the phase detector 12 in a conventional manner and to a divider control circuit 17. Divider control circuit 17 is connected to the programmable divider 16 and provides the divide or "N" information used by the divider.

Figure 2:
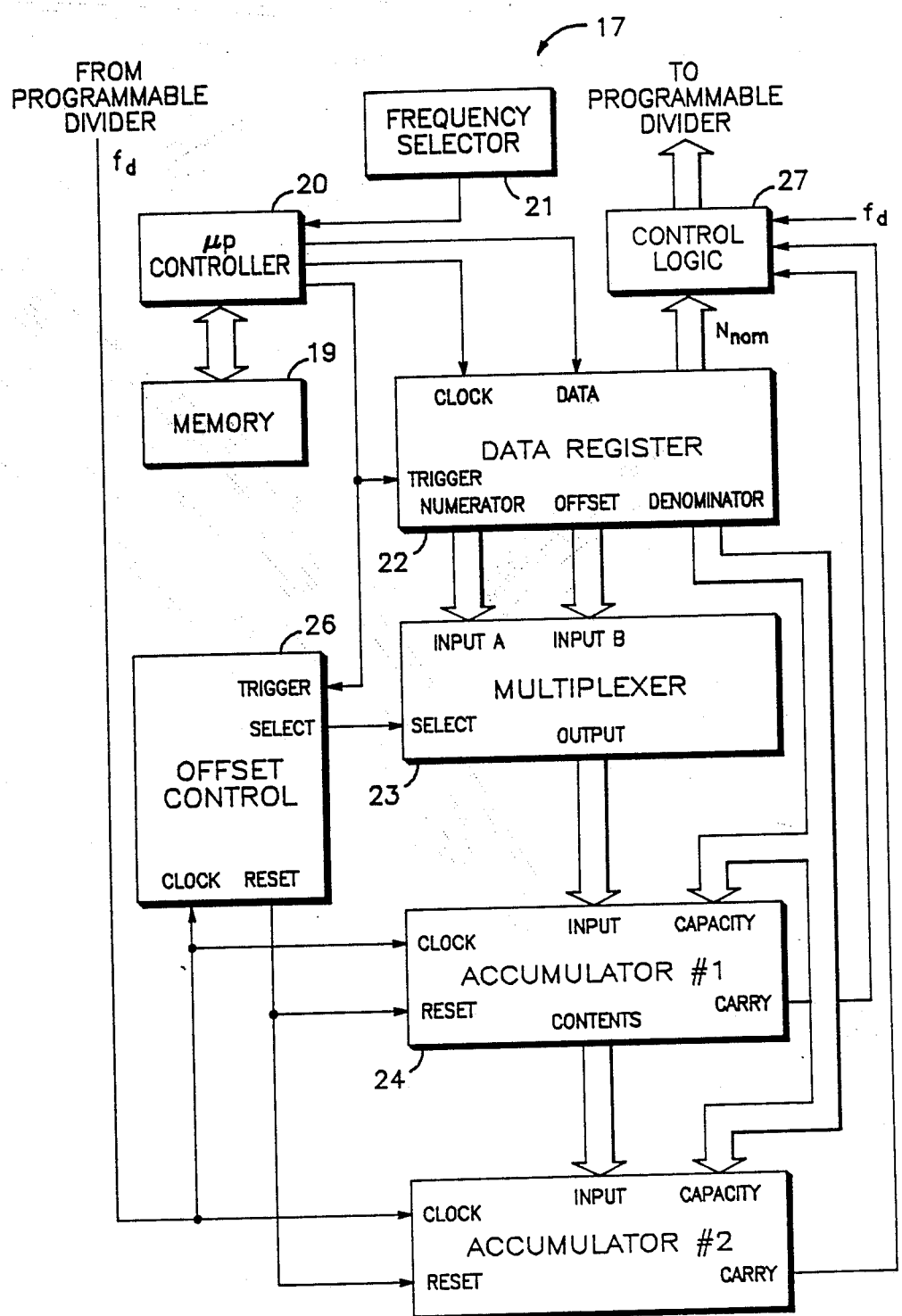
FIG. 2 is a block diagram of the divider control circuit of the frequency synthesizer of FIG. 1.

In a fractional N frequency synthesizer, the desired output frequency $f_o$ cannot be obtained utilizing a single divisor for the programmable divide by N divider 16. It is necessary to periodically adjust the value N in a manner such that the average output frequency is equal to the desired output frequency. The divider control circuit 17, as is shown in further detail in FIG. 2, is designed to provide the required N values to the programmable divider 16 while minimizing spurious signals.

A memory 19, constituting memory means, which can include a programmable read only memory as well as ROM and RAM is utilized to contain data for use by the divider control circuit 17 for obtaining the value N for application to the programmable divider 16. A microprocessor controller 20 is used to read the data from the memory 19 and supplies the data, via a data bus, to a data register 22 which serves also as a latch. A frequency selector 21 is coupled to the microprocessor controller 20 for choosing the synthesizer output frequency $f_o$. In applications such as two-way radios, the frequency selector corresponds to the channel switch.

The data register 22 provides the various data outputs which have been labeled as numerator or is the k value, offset, denominator or is the D value, and $N_{nom}$ which is the nominal value for the N divide value. The numerator and offset data lines are connected to A and B inputs respectively of a multiplexer 23. Output data lines of multiplexer 23 are connected to the input of a first accumulator 24 constituting first accumulator means. Its output, which is labeled contents, is connected to the input of a second accumulator 25 constituting second accumulator means. Each of the accumulators 24 and 25 has a capacity input connected to the denominator output of data register 22. Carry outputs are provided from both accumulators 24 and 25 and are connected to two inputs of a control logic circuit 27. The output of control logic circuit 27 is connected to the programmable divider 16. The $N_{nom}$ data line of data register 22 is also connected to the control logic circuit 27.

The microprocessor controller 20 provides an output that is applied to the trigger inputs of data register 22 and an offset control circuit 26. The offset control circuit 26 has a select output that is connected to a select input of multiplexer 23, and a reset output that is connected to reset inputs of the accumulators 24 and 25. Clock inputs of offset control 26, control logic 27 and accumulators 24 and 25 are provided with the $f_d$ output of programmable divider 16. Alternatively, these clock signals could be provided directly by the reference oscillator 11 as $f_d$ and $f_r$ are in phase lock.

Figure 3:
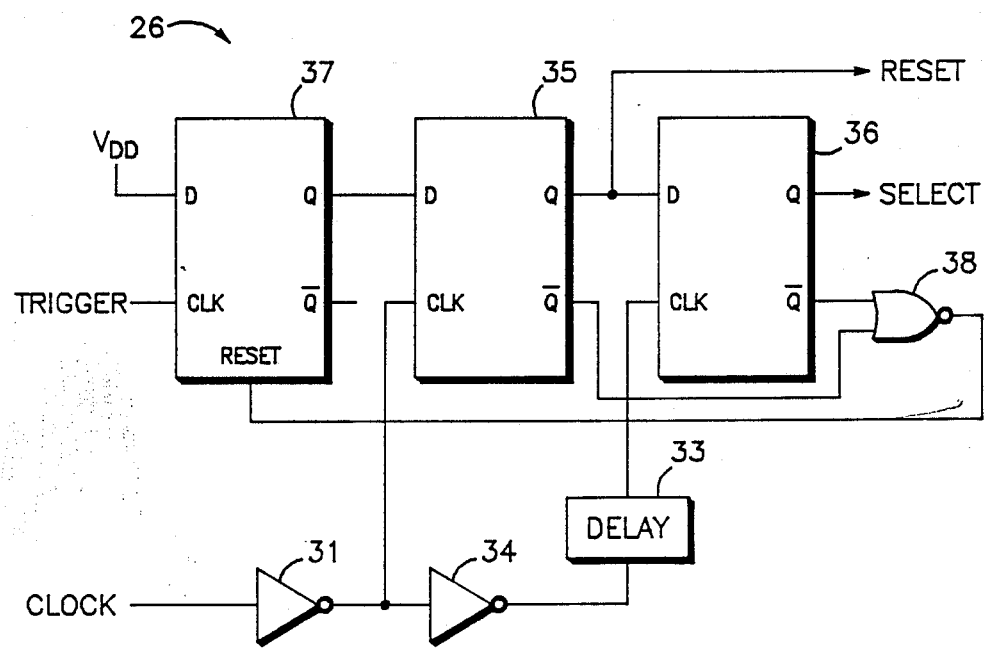
FIG. 3 is a block diagram of the offset control of FIG. 2.

Referring now to FIG. 3, the offset control circuit 26 is illustrated in further detail. The clock output from the programmable divider 16 is coupled to a series circuit comprised of inverters 31 and 34 and a delay element 33. The output of inverter 31 is connected to the input of inverter 34 which has its output coupled via the delay element 33 to the clock input of a flip-flop 36. The output of inverter 31 is also coupled to a clock input of a flip-flop 35. A flip-flop 37 has a D input coupled to $V_{DD}$ for maintaining the input high. Its clock input is the TRIGGER input of offset control 26. The Q input of flip-flop 37 is coupled to the D input of flip-flop 35. The RESET output of offset control 26 is provided by the Q output of flip-flop 35 which is also connected to the D input of flip-flop 36. The SELECT output of offset control 26 is provided by the Q output of flip-flop 36. The Q bar outputs of flip-flops 35 and 36 are connected to inputs of a NOR gate 38 which has its output coupled to the reset input of flip-flop 37.

Figure 4:
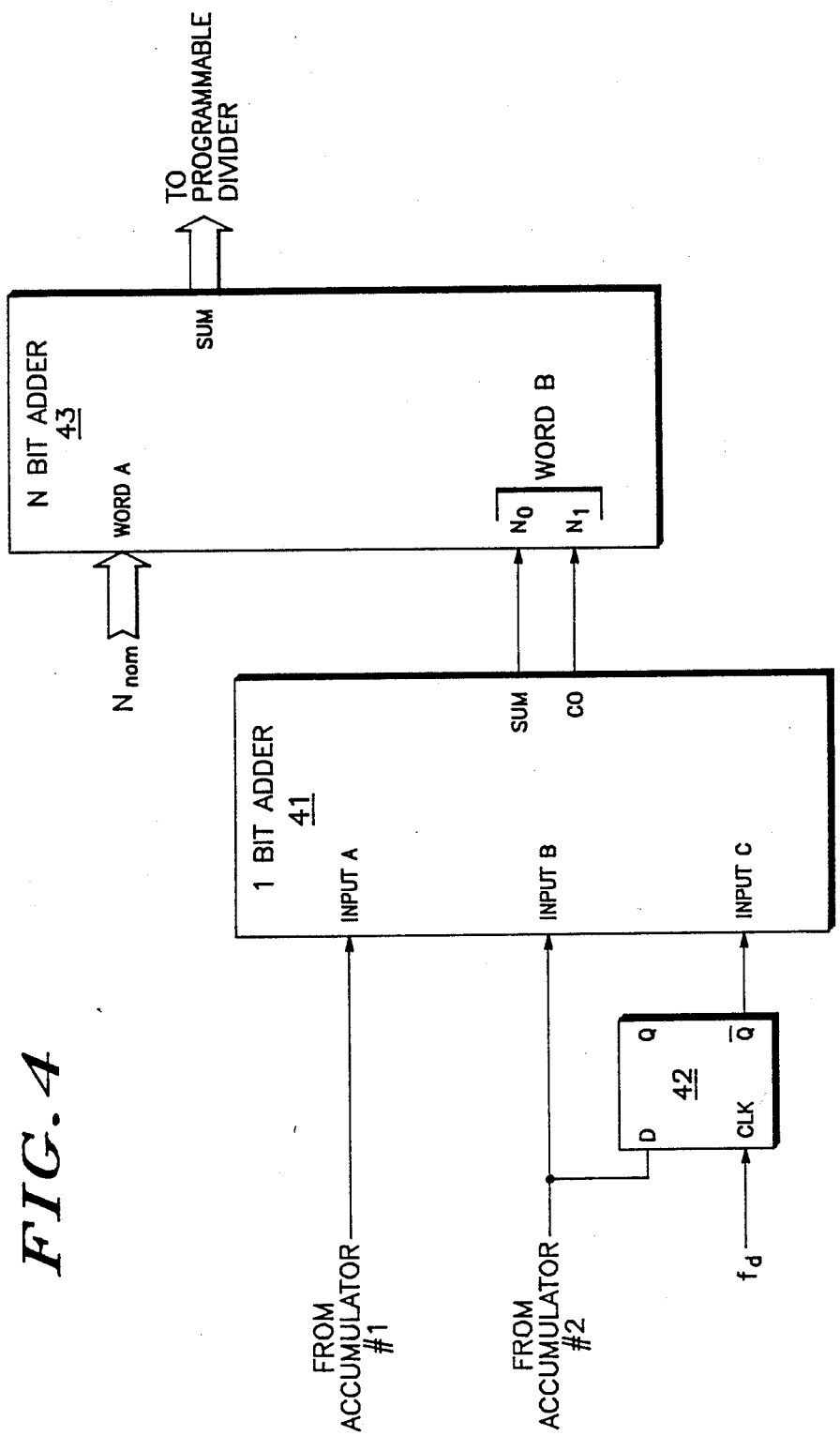
FIG. 4 is a block diagram of the control logic of FIG. 2.

Referring now to FIG. 4, a description of the control logic 27 will be given. The carry output of the accumulator 24 is fed to an input A of one bit adder 41, while, the carry output of the second accumulator 25 is fed to an input B of the adder 41 and to a D input of a flip-flop 42. The clock input of flip-flop 42 is connected to the output of programmable divider 16. The Q bar output of flip-flop 42 is coupled to input C of adder 41. The sum and carry outputs of adder 41 are applied to the least two significant bit positions, respectively, of the word B input of an adder 43. The $N_{nom}$ data stored in data register 22 is coupled to the word A input of adder 43. The sum output of adder 43 is the N value used as the divisor of the programmable divider 16.

Figure 5:
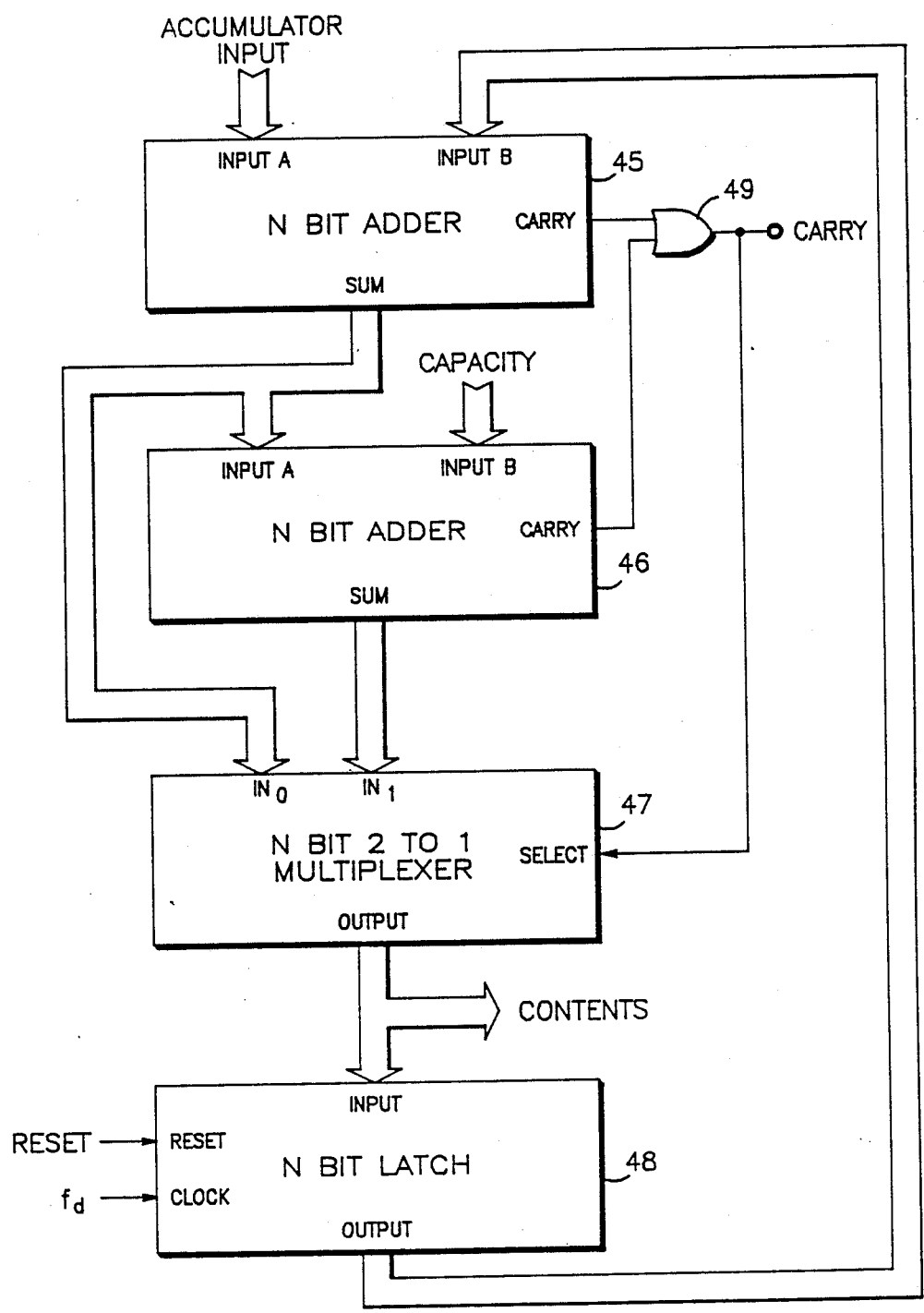
FIG. 5 is a block diagram of an accumulator of FIG. 2.

Referring now to FIG. 5, an accumulator of the type used for accumulators 24 and 25 of FIG. 2, is illustrated in detail. Two adders 45 and 46, 2-to-1 multiplexer 47 and latch 48 are connected serially through their respective inputs and outputs. The RESET output of offset control circuit 26 is coupled to the reset input of the latch 48 for initializing the output of the latch. The adder 45 sums the value at its input A, which is the accumulator input, with the output of latch 48 and applies the result to input A of the second adder 46, and also to the $IN_0$ input of 2-to-1 multiplexer 47. A value corresponding to the two's compliment of the capacity is applied at input B of adder 46, which is the accumulators CAPACITY input. The capacity is defined as being the minimum value which causes the accumulator to generate a carry signal. The sum from adder 46 is applied at the $IN_1$ input of the multiplexer 47. The carry outputs of the adders 45 and 46 are applied to inputs of an OR gate 49. The output of the OR gate 49 is brought out as the CARRY output of the accumulator. The output of OR gate 49 is coupled to the select input of multiplexer 47, to determine whether $IN_0$ or $IN_1$ of multiplexer 47 will be fed into the input of latch 48. The output of multiplexer 47 is the CONTENTS output of the accumulator. The clock input to latch 48, which is accumulator clock input, is pulsed to transfer the value from the input to the output of the latch.

Basically, in operation, if the accumulator capacity has been reached by adding any two numbers, the carry output from one of the adders 45 or 46 will be high. This will cause the output of OR gate 49 to go high which selects the $IN_1$ input of multiplexer 47 as the contents of the accumulator. This, in effect, subtracts the capacity from the original sum. If the sum of the two numbers does not exceed capacity, the carry outputs from the adders 45 and 46 will be low and the resultant low from OR gate 49 will select the sum $IN_0$ input of multiplexer 47 as the contents of the accumulator.

It is thought that the advantages of the frequency synthesizer have become fully apparent from the foregoing description of parts, but for completeness of disclosure a brief description of the operation and use of the circuit will be given. The divider control circuit 17 of the preferred embodiment utilizes a multiplexer and offset control to introduce an offset value in accumulators, for improved fractional N-synthesis. Various other circuit implementations could be utilized to obtain this desired control of the N divider including implementing the accumulators in a microprocessor.

The capacity of the accumulators 24 and 25 is a variable. Capacity information is stored with the other frequency information in the memory 19. The actual stored value is the 2's complement of the D value which is ultimately applied to the capacity inputs of accumulators 24 and 25. The value of D is derived from the equation D=$f_r$/channel spacing.

The input to accumulator 24 and, hence, the relationship between the two accumulators 24 and 25, is determined by which of two input words latched in the data register 22 is selected by the offset control 26 as the output of multiplexer 23 to be fed into the input of the first accumulator 24. The two input words are the numerator k for steady state conditions and the offset value which provides a predetermined starting value for the accumulators. The offset value for each desired frequency $f_o$ is stored in a table in memory 19 along with the other frequency information, namely numerator, denominator and $N_{nom}$ values which are loaded into data register 22. The offset value varies with k, D and the required application and can be found by trial and error in actual field tests and/or preliminarily by computer simulation. To provide an offset the value can not equal zero, the numerator or the denominator. If one of these values is utilized there would be no offset.

The offset control 26 determines when a particular input word will be selected. Upon initializing the synthesizer (i.e. selecting a new output frequency $f_o$) the microprocessor controller 20 provides a trigger signal to strobe data into the data register 22 and clock flip-flop 37 to transfer a high Q output from its D input into D input of flip-flop 35. When the inverted clock signal from inverter 31 clocks flip-flop 35, its high D input will be transferred to its Q output and the D input of flip-flop 36 and as a high reset signal to be applied at the reset inputs of accumulators 24 and 25. This causes the contents of both accumulators to asynchronously reset to the value applied at the input of accumulator 24 and inhibits their clock inputs. The reset is returned low. As a result of the high value at the D input of flip-flop 36, upon clocking from the delayed clock signal of delay element 33, the Q output of flip-flop 36 of the offset control circuit 26 toggles high to select the B input of the multiplexer 23. This causes the offset value to appear as the contents value of accumulator 24. At the same time, the low Q-bar outputs of flip-flops 35 and 36 reset the Q output of flip-flop 37 to low via the NOR gate 38. On the next clock cycle, the inverted clock signal clocks flip-flop 35 to return the reset signal back to low, allowing the accumulators to increment in response to the clock signals. On the next low to high transition of the clock signal, the value at the first accumulator 24 input is stored in accumulator 24. After a certain delay set by the delay element 33 clocking flip-flop 36, the low D input of flip-flop 36 is transferred as a low SELECT output. This low SELECT signal causes the input A value containing the numerator to be transferred to the output of the multiplexer 23 for steady state operation.

Whenever the frequency selector 21 is actuated to select a new output frequency $f_o$ the microprocessor controller 20 reads the data from memory 19 for the selected frequency causing the data to clocked into data register 22. The microprocessor controller 20 triggers the data register and offset control to cause the offset value to be applied to the first and second accumulators 24 and 25. The multiplexer 23 is then switched to provide the numerator value to the input of accumulator 24 where it is summed with the previously loaded offset value. For each clock pulse from the $f_d$ signal the numerator value is again summed with the contents of accumulator 24. Similarly, the output of accumulator 1 is summed in accumulator 25.

The first accumulator 24 has a capacity of D as does the second accumulator 25. For each clock cycle, an input is added to the contents of the first accumulator 24. Contents from the first accumulator 24 are added to the contents of the second accumulator 25. For each clock cycle the accumulator capacity D is reached, that particular accumulator overflows and a carry value of one is generated. Otherwise, a carry value of zero is generated.

For each reference clock cycle $f_d$, the control logic 27 generates an instantaneous divisor output N to the programmable divider 16 based on the inputs to the control logic from the radio memory register's programmed N value, the two instantaneous (i) carry outputs from the first and second accumulators, $C_{1i}$, $C_{2i}$, respectively and the previously stored carry output of the second accumulator $C_{2(i-1)}$ where $N=N_{nom}+C_{1i}+C_{2i}-C_{2(i-1)}$. The net effect over D cycles of the reference clock, is that k carry pulses are produced by the first accumulator 24. Accumulator 25 has no effect on the average value of N since the counts are always added and subtracted in pairs by the second accumulator 25. The average value of the programmable divisor then has a whole part equal to the programmed value N and a fractional part equal to k/D. In this way, a non-integer value for the loop divider is created to obtain the desired output frequency $f_o$ from the multiplication of the reference frequency fr by the non-integer loop divider where $f_o=f_r(N+k/D)$. While the circuit of the preferred embodiment utilizes the multiplexer 23 to load the offset into the first accumulator 24, other variations, such as loading the offset into the second accumulator 25 for loading the offset value directly to the input of the first accumulator 24 or second accumulator 25 for one or more clock cycles are possible.

For any particular output frequency $f_o$ it may be necessary to experiment for different values for the offset. Once an offset value has been determined which has an acceptable spurious response, that value is stored with the numerator, denominator and $N_{nom}$ in the memory 19 and is selected whenever that particular frequency is desired. For frequencies where an offset is not necessary zero or the numerator value can be stored in the memory 19 as the offset value. For a given frequency or channel spacing a single denominator or D-value can be utilized.

For a particular frequency $f_o$ it is also possible to vary both the N and D values and still obtain the same frequency output. When the variation of the offset value alone does not provide an acceptable spurious output level, selection of other N and D values for the frequency in conjunction with selection of an offset value can be utilized.

The use of variable capacity accumulators 24 and 25 permits the channel spacing of the synthesizer 10 to be easily changed. For example, to permit either 5 or 6¼ kHz channel spacing, the accumulators need only have sufficient capacity (i.e. length or number of bits) to support 5 kHz spacing. If fixed length accumulators were used, they would have to support 1¼ kHz spacing to synthesize both 5 and 6¼ kHz channels. This would require much larger accumulators than two programmable accumulators 24 and 25.

I claim as my invention:

1. A frequency synthesizer for providing a synthesized output frequency $f_o$ comprising:
   a synthesizer loop including a programmable divider;
   memory means for providing information for said synthesizer loop;
   a divider control means providing divider values to said programmable divider, said divider control means providing varying values to said programmable divider for fractional division to produce a desired output frequency $f_o$, and including at least a first and second accumulator means;
   said first accumulator means including an input for receiving data, a first output for varying said divide value, and a second output for providing data to said second accumulator means, and
   said second accumulator means including an input connected to said second output of said first accumulator means and an output for varying said divide value;
   means for providing an offset value to at least one of said first and second accumulator means.

2. The frequency synthesizer of claim 1 wherein said means for providing said offset value comprises:
   a data register means, said data register means including an input from said memory means to provide said data and said offset value, a first output for providing said data and a second output for providing said offset value for each desired output frequency $f_o$;
   an offset control means for selecting said second output of said data register means; and
   a multiplexer coupled to said first and second outputs of said data register means for providing said offset value to said accumulator in response to said offset control means.

3. The frequency synthesizer of claim 2 wherein said offset control means comprises inverting and delaying means coupled to a series of at least three flip-flops.

4. The frequency synthesizer of claim 3 wherein said offset control means comprises:
   a series circuit including at least a first and a second inverter and a delay element, said output of said series circuit is connected to a clock input of said third flip-flop;
   said second flip-flop includes a clock input for coupling to an output of said first inverter; and
   a NOR gate including inputs connected to a Q bar output of said second and of said third flip-flop and an output coupled to a reset input of said first flip-flop.

5. A method of providing a synthesized output frequency, comprising the steps of:
   (a) receiving data for providing a divider value to a programmable divider;
   (b) offsetting said data to provide an offset data;
   (c) accumulating said offset data to provide an accumulated signal and a first control signal;
   (d) accumulating said accumulated signal to provide a second control signal;
   (e) delaying and inverting said second control signal to provide a third control signal; and
   (f) varying said divider value in response to said first, second, and third control signals.

6. A method of providing a synthesized output frequency, comprising the steps of:
   (a) receiving data for providing a divider value to a programmable divider;
   (b) accumulating said data to provide an accumulated signal and a first control signal;
   (c) offsetting said accumulated signal to provide an offset accumulated signal;
   (d) accumulating said offset accumulated signal to provide a second control signal;
   (e) delaying and inverting said second control signal to provide a third control signal; and
   (f) varying said divider value in response to said first, second, and third control signals.

* * * * *